United States Patent [19]
Goepel et al.

[11] Patent Number: 5,149,685
[45] Date of Patent: Sep. 22, 1992

[54] ADJUSTING THE TRANSITION TEMPERATURE, THE SATURATION CURRENT DENSITY WITH AND WITHOUT A MAGNETIC FIELD AND THE PROPORTIONS OF NORMALLY CONDUCTING PHASES OF CERAMIC SUPERCONDUCTORS

[75] Inventors: Wolfgang Goepel, Tuebingen; Hans-Dieter Wiemhoefer, Eningen, both of Fed. Rep. of Germany

[73] Assignee: BASF Aktiengesellschaft, Ludwigshafen, Fed. Rep. of Germany

[21] Appl. No.: 262,979

[22] Filed: Oct. 26, 1988

[30] Foreign Application Priority Data

Oct. 27, 1987 [DE] Fed. Rep. of Germany ....... 3736301

[51] Int. Cl.[5] .................... H01L 39/00; H01L 39/12
[52] U.S. Cl. ........................... 505/1; 204/130; 505/825
[58] Field of Search ............... 204/130; 505/1, 825

[56] References Cited

U.S. PATENT DOCUMENTS

| | | | |
|---|---|---|---|
| 3,784,452 | 1/1974 | Martens et al. | 204/26 |
| 4,013,531 | 3/1977 | Nakamura et al. | 204/130 |
| 4,127,452 | 11/1978 | Martens et al. | 204/38.3 |
| 4,392,928 | 7/1983 | Yang et al. | 204/130 |
| 4,456,506 | 6/1984 | Stein et al. | 204/15 |

OTHER PUBLICATIONS

O'Sullivan et al, "Study of Oxygen Transport in $Ba_2YCu_3O_{7-\delta}$ Using a Solid State Electrochemical Cell", Appl Phys. Lett. 52(17) 1441-1443, Apr. 25, 1988.
Possible High $T_c$ Superconductivity in the Ba-La-Cu-O System, Bednorz and Muller, Z. Phys. B.-Condensed Matter 64, pp. 189-193 (1986).
Oxygen Stoichiometry in $Ba_2YCu_3O_x$, Gallagher et al., Mat. Res. Bull., vol. 22, pp. 995-1006.
Superconductivity at 155K, Ovshinsky et al., Physical Review Letters, vol. 58, No. 24, Jun. 15, 1987.

*Primary Examiner*—John Niebling
*Assistant Examiner*—Steven P. Marquis
*Attorney, Agent, or Firm*—Keil & Weinkauf

[57] ABSTRACT

The transition temperature, the saturation current density with and without a magnetic field and the proportions of normally conducting phases of ceramic superconductors having a structure derived from perovskite are adjusted by changing the content of the electronegative component or, where a plurality of such components is present, of one of the electronegative components in the ion lattice of the superconductor directly on the substrate.

4 Claims, 1 Drawing Sheet

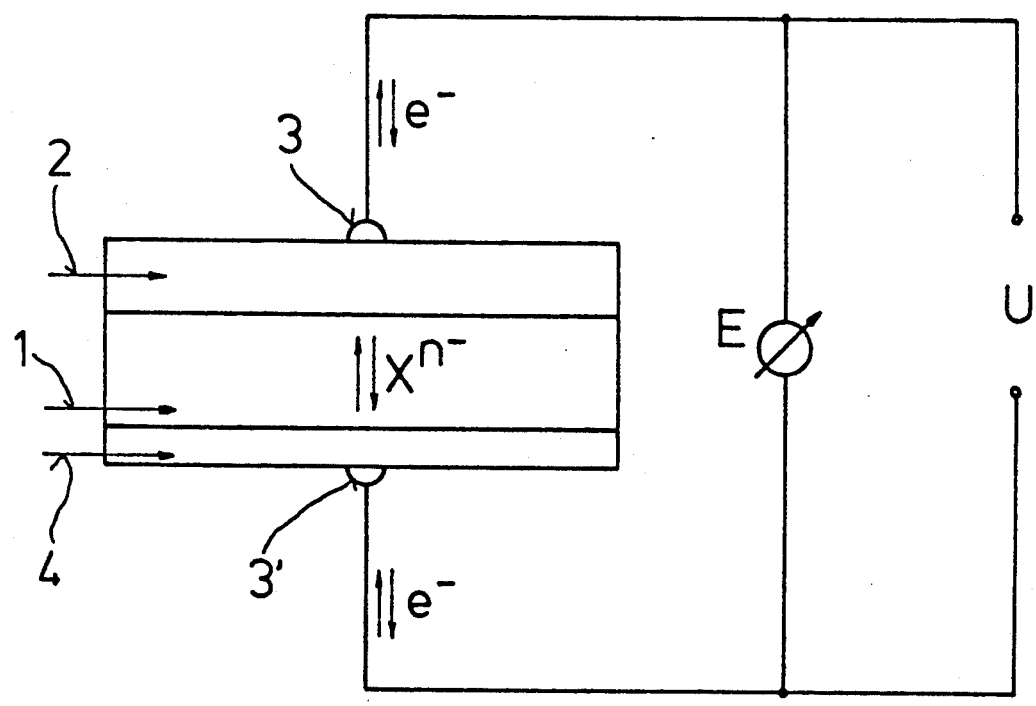

ADJUSTING THE TRANSITION TEMPERATURE, THE SATURATION CURRENT DENSITY WITH AND WITHOUT A MAGNETIC FIELD AND THE PROPORTIONS OF NORMALLY CONDUCTING PHASES OF CERAMIC SUPERCONDUCTORS

The present invention relates to a method for adjusting the transition temperature, the saturation current density with and without a magnetic field and the proportions of normally conducting phases of ceramic superconductors having a structure derived from perovskite, by changing the content of the electronegative component or, where a plurality of such components is present, of one of the electronegative components in the ion lattice of the superconductor.

The article by J. G. Bednorz and K. A. Müller which appeared in Zeitschrift für Physik, B 64 (1986), 189, gave a new direction to the investigations in the field of superconduction by pointing out the possibility of superconduction with comparatively high transition temperatures in ceramic materials in the La-Ba-Cu-O system. Activities arising from this have shown that materials based on a structure derived from perovskite are particularly promising. For example, P. K. Gallagher et al. in Mat. Res. Bull. 22 (1987), 995 et seq, describe the effect of the oxygen stoichiometry, or rather the effect of the nonstoichiometry, on the transition temperature ($T_c$) in the compound $Ba_2YCu_3O_{7-\delta}$. In these substances, a defined oxygen content is obtained by establishing a certain oxygen partial pressure and simultaneously heating the perovskite material to temperatures of up to 900° C. Because of the reaction kinetics, temperatures below 400° C. are unsuitable in the procedure described.

S. R. Ovshinsky et al. in Phys. Rev. Lett., 58, No. 24 (1987), 2579–2581, report on partial replacement of the oxygen in the superconductors having a structure derived from perovskite by fluorine, and on the resulting change in the transition temperature. In this case too, a high oxygen partial pressure and high temperatures are required for the preparation of these materials.

The disadvantages of the procedures described are, in particular, the high preparation temperatures of up to 900° C. and the uncontrolled changes in the crystal structure and chemical composition during the cooling phase after this treatment. In the subsequent cooling phase, special measures are required to retain the crystalline structure and chemical composition of these substances and to establish the intended working temperature of the superconductors. Moreover, with this method of preparation, the superconductors thus obtained may show signs of aging during subsequent use. This imposes limits on both the transition temperature, the saturation current density with and without a magnetic field and the proportions of normally conducting phases and on the possible general electronic applications, for example in magnetic field sensors.

It is an object of the present invention to provide a method for adjusting the transition temperature, the saturation current density with and without a magnetic field and the proportions of normally conducting phases of ceramic superconductors having a structure derived from perovskite, which method is substantially free of the abovementioned disadvantages. In particular, it is an object of the present invention to provide a method for adjusting the transition temperature, the saturation current density with and without a magnetic field and the proportions of normally conducting phases in a low-temperature preparation.

We have found that this object is achieved by a method for adjusting the transition temperature, the saturation current density with and without a magnetic field and the proportions of normally conducting phases in ceramic superconductors having a structure derived from perovskite by changing the content of one or more of the electronegative components in the ion lattice of the superconductor if (1) a superconductor having a structure derived from perovskite is applied to one side of an ion-conducting substrate whose mobile ion type $X^{n-}$ corresponds to an electronegative component $X$ of the superconductor and (2) an electron-conducting contact is mounted on the free side of the superconductor and a second electron-conducting contact is mounted on a free side of the ion conductor, and (3) the chemical potential of the electronegative component $X$ is then preset at the electron-conducting contact on the ion conductor side and (4) finally the content of the electronegative component $X$ in the ion lattice of the superconductor is adjusted by applying a constant voltage until the current flow reaches zero.

In another advantageous embodiment of the novel method, the content of the electronegative component $X$ in the ion lattice of the superconductor is also adjusted by means of a constant current flow over the two electron-conducting contacts. This current flow is generally maintained until the open circuit voltage between the electron-conducting contacts assumes a value which corresponds to the desired content of the electronegative component $X$ according to the composition predetermined for the maximum transition temperature of the superconductor. This is monitored by the measurement of the voltage during brief interruption of the current.

According to the novel method, the change in the content of one or more of the electronegative components in the ion lattice of the superconductor means that, where only one component is present, its content si changed and, where a plurality of different components is present, the content of one or more of these components is changed.

Superconductors having the stated structure are, in particular, those of the formula

$$A_xB_yCu_zX_{t-\delta}.$$

In this formula, A is one or more rare earth elements, B is one or more alkaline earth metals and X is oxygen or oxygen together with fluorine. Examples are $La_{1.85}Sr_{0.15}CuO_{4-\delta}$ and $YBa_2Cu_3O_{7-\delta}$. These structures are derived from the ideal perovskite structure which contains two metal atoms for every three oxygen atoms. Compared with the ideal perovskite, the oxidic superconductors have a substantially lower oxygen content, so that $$3/2(x+y+z) > t-\delta.$$

$\delta$ is a number which is less than one or about one and describes changes in the oxygen content of the superconductor which are dependent on the oxygen partial pressure. The novel method is independent of the type of metal atoms A and B and of the specific values for x, y, z and t, since it relates only to the content of the electronegative components at constant coefficients x, y and z.

The preparation of these materials is known and is generally carried out by mixing carbonates, nitrates or binary oxides of the metals A, B and Cu present, in the desired stoichiometric ratio, and then sintering the mixture under air or a controlled oxygen-rich atmosphere or by oxidation of mixtures or alloys of the metals present, or, when thin film technology is used, by reactive evaporation or sputtering.

The resulting superconducting material is applied to the ion-conducting substrate subsequently or directly during the preparation.

Examples of suitable ion-conducting substrates are doped oxygen ion-conducting oxides, such as $ZrO_2$, $ThO_2$, $CeO_2$ and/or $Bi_2O_3$, in each case in the form stabilized with, inter alia, CaO or $Y_2O_3$. Where oxygen is partially replaced by fluorine in superconductors of the formula (I), other suitable ion conductors are $CaF_2$, $LaF_3$ and $BiF_3$.

According to the novel method, this unit comprising ion conductor and superconductor is then brought to a predetermined chemical potential on the ion conductor side. Where oxygen is the electronegative component in question, a constant residual gas atmosphere which can be varied within wide pressure ranges is suitable for this purpose. Where oxygen is the electronegative component in the ion lattice of the superconductor, oxygen partial pressures of about 1 bar are advantageous in the case of $YBa_2Cu_3O_{7-\delta}$.

The chemical potential can be obtained in a particularly advantageous manner by in a state of equilibrium, with a number N of components to the ion-conducting substrate, one of the components corresponding to the component which is mobile in the ion-conducting substrate and the number N equals the number P. If this component is oxygen, as, for example, in the case of zirconium dioxide, this chemical potential can be achieved by means of the equilibrium of a solid binary oxide with the corresponding pure metal as the second phase, or with a second oxide of different valency. The same applied to fluorine as the electronegative component. For example, suitable two-phase systems include the following: Fe/FeO, Ni/NiO, Cu/Cu$_2$O, Cu$_2$O/CuO, Ca/CaF$_2$ and Bi/BiF$_3$.

A contact consisting of an electron conductor is then mounted on this generally wafer-like arrangement of ion-conducting substrate and superconductor present thereon, or of the abovementioned two-phase system comprising ion-conducting substrate and superconductor present thereon, on both sides of the said arrangement, i.e. both on the substrate side or the two-phase system side and on the superconductor side. This contact usually consists of platinum, gold or silver. The contact material used for the second conductor, which is present not on the superconductor but on that side which is at constant chemical potential of the component X, can also be another oxide having a perovskite structure, e.g. $LaNiO_{3-\delta}$.

In the arrangement described, the voltage now to be applied to both contacts results in an adjustment of the content of the electronegative component in the ion lattice of the superconductor and hence in an adjustment of the transition temperature. The said voltage can be obtained using Nernst's equation. Accordingly, the voltage or electromotive force (EMF) E, obtained by currentless measurement is $$E = \frac{1}{nF}[\mu_x(\text{Superc.}) - \mu_x(\text{second contact})]$$

$$= E^O + \frac{RT}{2nF} \ln P_{x2}(\text{Superc.})$$

This clearly relates E to the chemical potential $\mu_x$ and the partial pressure $P_{x2}$ in the superconductor. n is the valency of the ions $X^{n-}$ which are mobile in the ion conductor. This also fixes the content of electronegative component X in the superconductor.

If, for example, the process where X is oxygen is considered using the novel method and a voltage E' which differs from the EMF is applied, an oxygen ion current flows through the $ZrO_2$. If E' is greater than the EMF, oxygen ions are transported from the reference electrode through the $ZrO_2$ to the superconducting material, with the result that the oxygen content is increased. Conversely, the oxygen content in the superconducting material is reduced if E' is kept smaller than the EMF. By changing the oxygen content, the chemical potential $\mu(O_2)$ and the partial pressure $P(O_2)$ also change. In general, the voltage is applied until current no longer flows, and hence the new EMF E corresponds to the applied voltage E' with the new partial pressure $P(O_2)$.

The novel method provides a surprisingly simple means of adjusting the content of the electronegative component in the ion lattice of a superconductor having a perovskite structure and hence of adjusting the transition temperature. This method proceeds in a simple and particularly readily reproducible manner at temperatures which are low compared with the prior art, i.e. at below 400° C. If a special ion conductor and suitable contacts are used, even lower working temperatures of, for example, 200° C. are possible. Another advantage of this method is that it permits the regeneration of superconductors whose transition temperature, saturation current density with or without a magnetic field and proportions of normally conducting phases no longer conform to the predetermined values, owing to aging processes. It is generally true of the novel method that, in the case of the superconductors having a structure derived from perovskite, the transition temperature, the saturation current density with and without a magnetic field and the proportions of normally conducting phases can be varied within wide limits within the range characteristic of the material and can also be regenerated.

The novel method is illustrated by the drawing, by way of Example. The drawing shows an ion-conducting substrate 1, for example a $Y_2O_3$-doped $ZrO_2$, on one side of which the superconductor 2, for example one of the formula $YBa_2Cu_3O_{7-\delta}$, and the electron-conducting contact 3 are mounted, and on the other side of which the mixture 4 which produces the chemical potential of the electronegative component, for example a Cu/Cu$_2$O mixture, is applied, an electron-conducting contact 3' being mounted in turn on the said mixture. By applying a constant voltage U to the contacts 3 and 3' with the EMF E measured at zero current, the content of the electronegative component X in the superconductor 2 is adjusted by transport of this component.

We claim:

1. A method for adjusting the transition temperature, the saturation current density with and without a magnetic field and the proportions of normally conducting phases in ceramic superconductors having a structure derived from perovskite, by changing the content of one or more of the electronegative components throughout the entire ion lattice of the superconductor, by a non-stoichiometric amount, wherein (1) a superconductor having a structure derived from perovskite is applied to one side of an ion-conducting substrate whose mobile ion type $X^{n-}$ corresponds to an electronegative component X of the superconductor, said electronegative component X having a chemical potential, and (2) an electron-conducting contact is mounted on the side of the superconductor which is non-contiguous to the ion-conducting substrate, and a second electron-conducting contact is mounted on the side of the ion conductor which is non-contiguous to the superconductor, and (3) the chemical potential of the electronegative component X is then preset at the electron-conducting contact on the ion conductor side and (4) finally the content of the electronegative component X in the ion lattice of the superconductor is adjusted by applying a constant voltage at a temperature of less than 400° C. until the current flow reaches zero.

2. A method as claimed in claim 1, wherein the chemical potential of the electronegative component X is obtained by means of a constant residual gas atmosphere having the electronegative component X as a constituent.

3. A method as claimed in claim 1, wherein the chemical potential of the electronegative component X is obtained by means of a mixture of a number P of solid phases with a number N of components, one of said components being the electronegative component X, and the number N being equal to the number P.

4. A method for adjusting the transition temperature, the saturation current density with and without a magnetic field and the proportions of normally conducting phases in ceramic superconductors having a structure derived from perovskite, by changing the content of one or more of the electronegative components throughout the entire ion lattice of the superconductor by a non-stoichiometric amount, wherein (1) a superconductor having a structure derived from perovskite is applied to one side of an ion-conducting substrate whose mobile ion type $X^{n-}$ corresponds to an electronegative component X of the superconductor, said electronegative component X having a chemical potential, and (2) an electron-conducting contact is mounted on the side of the superconductor which is non-contiguous to the ion-conducting substrate, and a second electron-conducting contact is mounted on the side of the ion conductor which is non-contiguous to the superconductor, and (3) the chemical potential of the electronegative component X is then preset at the electron-conducting contact on the ion conductor side and (4) finally, the content of the electronegative component X in the ion lattice of the superconductor is adjusted by means of a constant current flow at a temperature of less than 400° C.

* * * * *